United States Patent [19]
Won et al.

[11] Patent Number: 6,136,641
[45] Date of Patent: Oct. 24, 2000

[54] METHOD FOR MANUFACTURING CAPACITOR OF SEMICONDUCTOR DEVICE INCLUDING THERMAL TREATMENT TO DIELECTRIC FILM UNDER HYDROGEN ATMOSPHERE

[75] Inventors: Seok-jun Won, Seoul; Kab-jin Nam; Young-wook Park, both of Kyungki-do, all of Rep. of Korea

[73] Assignee: Samsung Electronics, Co., Ltd., Suwon, Rep. of Korea

[21] Appl. No.: 09/134,063

[22] Filed: Aug. 13, 1998

[30] Foreign Application Priority Data

Aug. 14, 1997 [KR] Rep. of Korea ........................ 97-38931

[51] Int. Cl.[7] ................................................. H01L 21/70
[52] U.S. Cl. ........................... 438/240; 438/238; 438/241; 438/381
[58] Field of Search ..................................... 438/238, 488, 438/442, 481, 482, 486, 489, 381; 257/310, 295, 240, 241

[56] References Cited

U.S. PATENT DOCUMENTS

| | | | |
|---|---|---|---|
| 5,397,748 | 3/1995 | Watanabe et al. | 437/239 |
| 5,478,780 | 12/1995 | Koerner et al. | 437/190 |
| 5,622,607 | 4/1997 | Yamazaki et al. | 204/192.15 |
| 5,763,300 | 6/1998 | Park et al. | 438/240 |
| 5,811,872 | 9/1998 | Machida et al. | 257/635 |
| 5,843,829 | 12/1998 | Kuramae et al. | 438/396 |
| 5,978,259 | 11/1999 | Son et al. | 365/182 |
| 6,015,990 | 1/2000 | Hieda et al. | 257/310 |

*Primary Examiner*—Matthew Smith
*Assistant Examiner*—V. Yevsikov
*Attorney, Agent, or Firm*—Marger Johnson & McCollom, P.C.

[57] ABSTRACT

A capacitor fabricating method for a semiconductor device where a dielectric film is thermally treated under hydrogen atmosphere to improve interface characteristics between the dielectric film and an electrode. In the method, a lower electrode is formed on a semiconductor substrate. A dielectric film is formed on the lower electrode. The dielectric film is thermally treated under hydrogen atmosphere. An upper electrode is formed on the dielectric film, thereby completing formation of the capacitor. The thermal treatment under the hydrogen atmosphere is performed at a temperature of 300 to 600° C. using $H_2$ gas or $H_2$ plasma for 5 to 60 minutes. Thus, the density of an interface trap between the electrode and the dielectric film of the capacitor is reduced.

28 Claims, 3 Drawing Sheets

METHOD FOR MANUFACTURING CAPACITOR OF SEMICONDUCTOR DEVICE INCLUDING THERMAL TREATMENT TO DIELECTRIC FILM UNDER HYDROGEN ATMOSPHERE

BACKGROUND OF THE INVENTION

1. Field of the Invention

The present invention relates to a semiconductor device fabricating method, and more particularly, to a method for fabricating a capacitor of a semiconductor device for reducing leakage current between a dielectric film and an electrode.

2. Description of the Related Art

Capacitance (C) of a capacitor in a semiconductor device is expressed by the following Equation 1.

$$C = \frac{\varepsilon_0 \cdot \varepsilon_r \cdot A}{d} \quad (1)$$

Here, $\epsilon_0$ denotes permittivity in a free space, $\epsilon_r$ denotes a dielectric constant of the particular dielectric film used, A denotes an effective area of an electrode, and d denotes the thickness of the dielectric film. As can be seen from Equation 1, capacitance is increased by changing three variables, i.e., the dielectric constant of the dielectric film, the effective area of a capacitor, and the thickness of the dielectric film.

Each of these methods for increasing the capacitance has its drawbacks. When a material having a large dielectric constant is used in a dielectric film to increase the capacitance of a capacitor, the energy band gap of the material is reduced, thereby increasing leakage current. The leakage current also increases if the thickness of the dielectric film is reduced.

Also, when a capacitor having a three-dimensional structure is fabricated to increase the effective area of the capacitor, the process thereof is complicated and the cost for the process increases.

As another drawback, a silicon dangling bond effect occurs at the interface between a silicon and a silicon oxide film in a transistor of a semiconductor device. The dangling bond forms an interface trap which operates as a trap level with respect to an electron. The interface trap affects the height of a Schottkey barrier, thus causing variation of a threshold voltage.

In the case of a capacitor, also, an interface trap exists between the electrode and the dielectric film which affects the height of the Schottkey barrier. Here, as the height of the barrier is lower, an electron passes more easily through the interface between the electrode and the dielectric film when a voltage is applied. As the dielectric film becomes thinner, the interface state between the electrode and the dielectric film has a significant influence. The height of this barrier has a direct effect on the leakage current depending on the interface state between the electrode of a capacitor and dielectric film.

Accordingly, the need exists for capacitors in semiconductor devices wherein leakage current is minimized.

SUMMARY OF THE INVENTION

An object of the present invention is to provide a method for fabricating a capacitor for a semiconductor device, wherein leakage current is reduced by improving the interface state between a dielectric film and an electrode, and capacitance can be increased by thinning the dielectric film.

To accomplish the above object, a lower electrode is formed on a semiconductor substrate. A dielectric film is formed on the lower electrode. The dielectric film is thermally treated under hydrogen atmosphere. An upper electrode is formed on said dielectric film, thereby completing formation of the capacitor.

The step of performing a thermal treatment under hydrogen atmosphere is performed using $H_2$ gas or $H_2$ plasma for 5 to 60 minutes at a temperature of 300° to 600° C.

In an alternate method for forming a capacitor according to the invention, a lower electrode is formed on a semiconductor substrate. A dielectric film is formed on the lower electrode. An upper electrode is formed on the dielectric film. The resultant structure is thermally treated under hydrogen atmosphere, thereby completing formation of the capacitor.

According to the present invention, leakage current through the dielectric film is reduced by improving the interface state between the dielectric film and the electrode through thermal treatment under hydrogen atmosphere. Thus, the dielectric film can be thinned without causing an increase in leakage current, so that the capacitor capacitance is increased.

BRIEF DESCRIPTION OF THE DRAWINGS

The above object and advantage of the present invention will become more apparent by describing in detail a preferred embodiment thereof with reference to the attached drawings in which.

DETAILED DESCRIPTION OF THE INVENTION

When a doped polysilicon is used as a lower electrode to form a capacitor of a semiconductor device, and when a dielectric film is deposited on the doped polysilicon or the deposited dielectric film is thermally treated under oxygen atmosphere, dangling bonds are formed at the interface between the lower electrode and the dielectric film, to generate an interface trap.

The interface trap formed at the interface affects the height of a Schottkey barrier between the electrode and the dielectric film of a capacitor. These effects are inversely related. That is, as the occurrence of dangling bonds at the interface increases, the height of the Schottkey barrier decreases. Likewise, as the occurrence of dangling bonds decreases, the height of the Schottkey barrier increases.

In the preferred embodiments of the present invention, in order to reduce the density of the interface trap formed at the interface between the lower electrode and the dielectric film, thermal treatment is performed under hydrogen ($H_2$) atmosphere before or after forming an upper electrode, after formation of the dielectric film.

Embodiment 1

Figure 1:
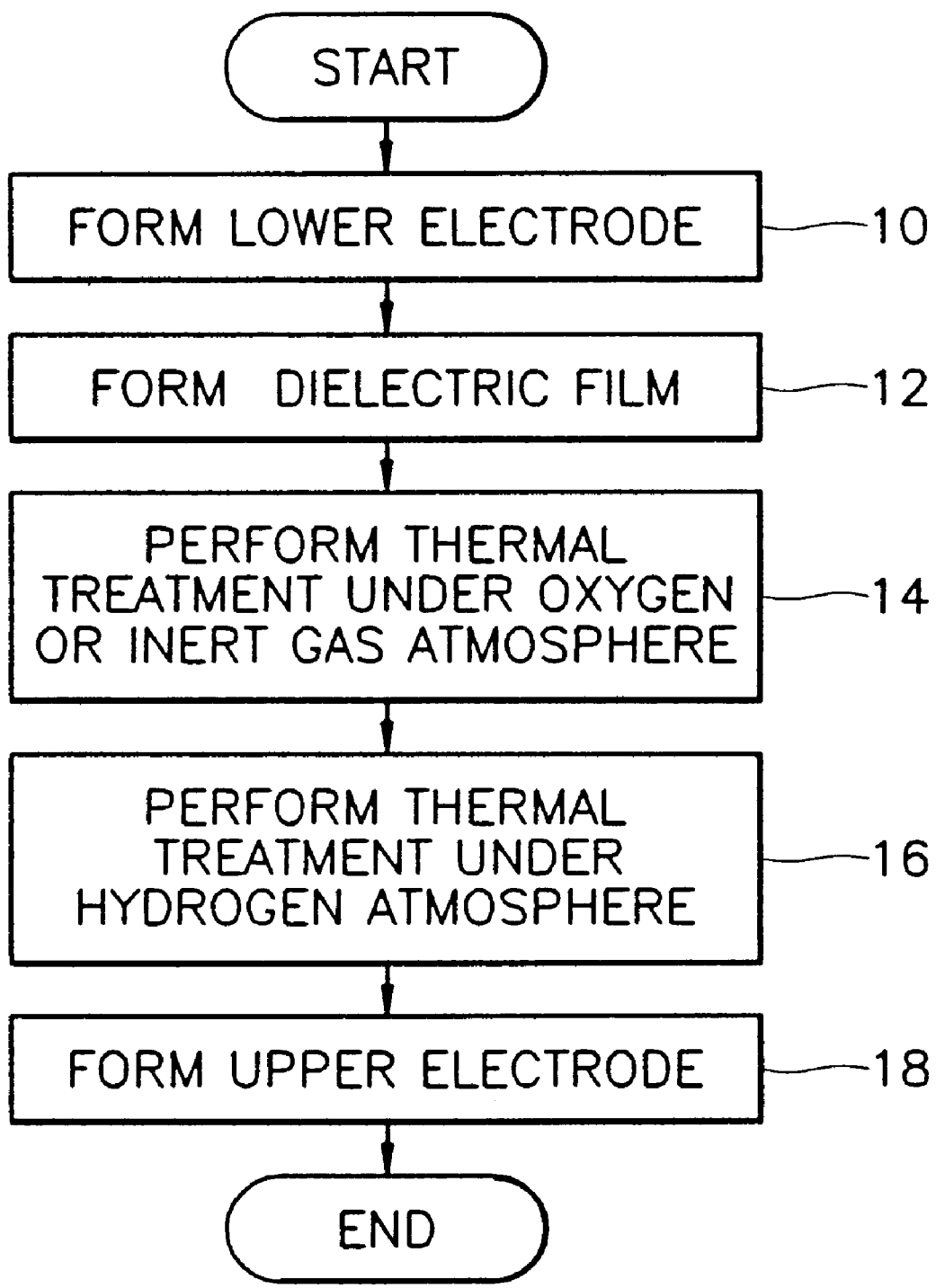
FIG. 1 is a flowchart for illustrating a method of forming a capacitor of a semiconductor device according to a first embodiment of the present invention.

FIG. 1 is a flowchart for illustrating a method of forming a capacitor of a semiconductor device according to a first embodiment of the present invention.

Referring to FIG. 1, first, a lower electrode is formed on a semiconductor substrate in step 10. The substrate can be of the type where devices such as transistors are formed where the devices are connected to an active region of the semiconductor substrate. The lower electrode is formed of one selected from the group consisting of impurity-doped polysilicon, metal, metal silicide, metal nitride, or any combination thereof.

When the lower electrode is formed of the impurity-doped polysilicon, a native oxide film additionally formed during the formation of the lower electrode is removed in a preprocessing step. Then, rapid thermal nitration (RTN) is performed or the RTN and rapid thermal oxidation (RTO) are performed together. Such a preprocessing step prevents a silicon oxide film from being thickly formed between the lower electrode and a dielectric film when the dielectric film is thermally treated in an oxygen atmosphere in a later processing step.

Next, a dielectric film is formed on the lower electrode in step 12. The dielectric film can be formed of a material selected from the group consisting of silicon oxide ($SiO_2$), silicon nitride ($Si_3N_4$), metal oxide such as tantalum oxide ($Ta_2O_5$), titanium oxide ($TiO_2$) or aluminum oxide ($Al_2O_3$), a ferroelectric material such as PZT($PbZr_xTi_{1-x}O_3$), BST ($Ba_xSr_{1-x}TiO_3$) or ST($SrTiO_3$), or any combination thereof.

Then, the resultant structure on which the dielectric film is formed is thermally treated in an oxygen atmosphere in step 14. The thermal treatment in the oxygen atmosphere is performed for about 5 to 60 minutes at a temperature of about 300 to 1000° C. using a wet $O_2$, a dry $O_2$, an $N_2O$ gas or each plasma thereof. For instance, the thermal treatment can be performed at a temperature of about 800° C. for about 30 minutes in the case of using the dry $O_2$. The thermal treatment is performed at much lower temperature in the case of using the plasma. The thermal treatment in the oxygen atmosphere is not essential for the present embodiment, and it can be omitted as needed. Alternatively, the thermal treatment can be performed in an inactive atmosphere instead of the oxygen atmosphere. In this later case, the thermal treatment is performed at a temperature between about 500 and 900° C. using an inert gas such as $N_2$ or Ar gas for about 5 to 60 minutes.

Thereafter, the resultant structure is thermally treated under hydrogen atmosphere in step 16. The thermal treatment in the hydrogen atmosphere is performed at about 300 to 600° C., preferably, at about 300 to 500° C., using $H_2$ gas or $H_2$ plasma, for about 5 to 60 minutes, preferably, for 5 to 30 minutes. For instance, when the $H_2$ gas is used, the thermal treatment is performed at a temperature of about 450° C. for about 10 minutes. It is possible that the inert gas is further included during the thermal treatment in the hydrogen atmosphere. Dangling bonds existing at the interface between the lower electrode and the dielectric film are removed by the thermal treatment in the hydrogen atmosphere. Thus, the density of the interface trap can be reduced. Therefore, the interface state between the dielectric film and the electrode is improved to decrease leakage current.

Then, an upper electrode is formed on the dielectric film to complete the capacitor, in step 18. The upper electrode is preferably formed of a material selected from the group consisting of impurity-doped polysilicon, metal, metal silicide, metal nitride, or any combination thereof.

Embodiment 2

The second embodiment is almost the same as the first embodiment, except no that the thermal treatment under hydrogen atmosphere is performed not after the step of forming the dielectric film but after the step of forming the upper electrode.

Figure 2:
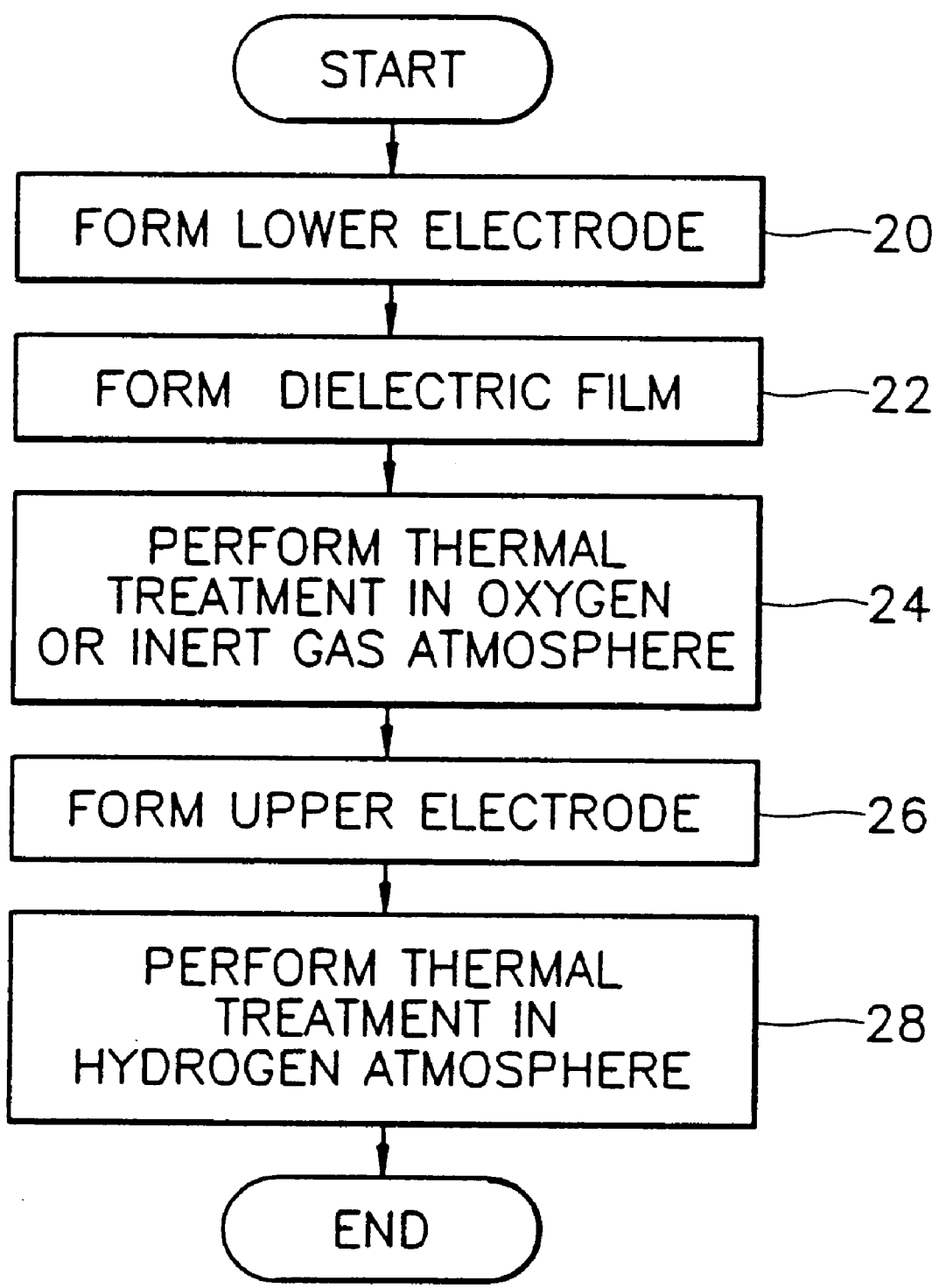
FIG. 2 is a flowchart for illustrating a method of forming a capacitor of a semiconductor device according to a second embodiment of the present invention.

FIG. 2 is a flowchart for illustrating a method of forming a capacitor of a semiconductor device according to a second embodiment of the present invention.

Referring to FIG. 2, like in steps 10, 12 and 14 of the first embodiment, a lower electrode and a dielectric film are formed on a semiconductor substrate in steps 20 and 22, and the resultant structure on which the dielectric film is formed is thermally treated under oxygen atmosphere in step 24. Alternatively, the thermal treatment can be performed under inert gas atmosphere instead of the oxygen atmosphere. In this later case, the thermal treatment is performed at a temperature between 500 and 900° C. using an inert gas such as $N_2$ or Ar gas for about 5 to 60 minutes.

Thereafter, an upper electrode is formed on the dielectric film in step 26. The upper electrode is preferably formed of a material selected from the group consisting of impurity-doped polysilicon, metal, metal silicide, metal nitride, or any combination thereof.

Then, the resultant structure including the upper electrode is thermally treated under hydrogen atmosphere in step 28. Preferably, the thermal treatment under the hydrogen atmosphere is performed at a temperature between 300 and 500° C. using $H_2$ gas or $H_2$ plasma for 5 to 30 minutes. For instance, when using the $H_2$ gas, the thermal treatment is performed at a temperature of about 450° C. for about 10 minutes. An inert gas can be additionally diffused into the hydrogen atmosphere. The dangling bonds existing at the interface between the lower electrode and the dielectric film are eliminated by the thermal treatment of the device under the hydrogen atmosphere, so that the density of the interface trap is reduced. Therefore, the interface state between the dielectric film and the electrode is improved, so that leakage current through the interface therebetween is decreased.

COMPARATIVE EXAMPLE

Figure 3:
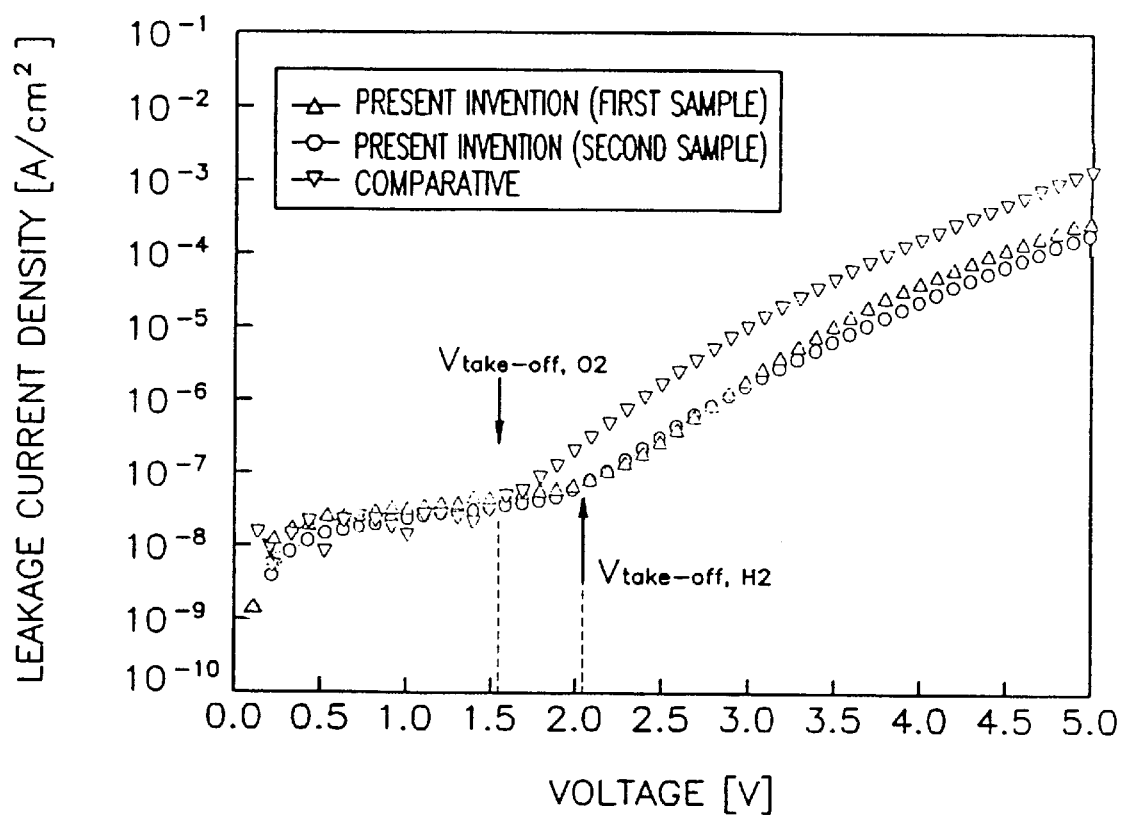
FIG. 3 is a graph illustrating the reduced leakage current characteristics of capacitors formed using the methods shown in FIGS. 1 and 2 over conventionally to formed capacitors.

FIG. 3 is a graph illustrating the decreased leakage current characteristic of capacitors formed according to the present invention compared to capacitors formed using conventional methods.

In order to obtain the results of FIG. 3, the capacitors of first and second samples (-Δ-) and (-○-) were fabricated using the method described above with reference to FIGS. 1 and 2, respectively. Also, the capacitor of a comparative sample (-▽-) was fabricated using conventional methods. Then, the density of leakage current at each operation voltage was measured.

The first sample was fabricated as follows. First, a lower electrode of impurity-doped polysilicon is formed on a semiconductor substrate. A dielectric film of tantalum oxide ($Ta_2O_5$) was formed on the lower electrode. An oxygen-atmosphere thermal treatment was performed on the resultant structure on which the dielectric film was formed, at a temperature of 800° C. using wet $O_2$ for 30 minutes. The resultant structure was again thermally treated at a temperature of 450° C. using $H_2$ gas under a hydrogen atmosphere for 30 minutes. Thereafter, an upper electrode was formed by sequentially stacking a TiN film and a tungsten silicide film, thereby completing formation of the capacitor.

The second sample was fabricated in a similar manner as the first sample. However, a thermal budget scheduled to be applied to a subsequent process after forming the upper electrode was provided in advance to verify effect according to the thermal budget in the subsequent process. In this state, an inert gas atmosphere thermal treatment was performed at a temperature of 750° C. using $N_2$ gas for 30 minutes.

In order to fabricate the comparative sample, a lower electrode and a dielectric film were formed in the same manner as the first sample. Only the oxygen-atmosphere thermal treatment was performed on the resultant structure on which the dielectric film was formed, at a temperature of 800° C. using the dry $O_2$ for 30 minutes. An upper electrode was formed in the same manner as the first sample, thereby completing formation of the capacitor. Thereafter, a thermal treatment under inert gas atmosphere was performed at a temperature of 750° C. using $N_2$ gas for 30 minutes.

Leakage current density was then measured at different operation voltage for each of the samples described above. The results of this test are shown in FIG. 3. The point ($V_{take-off}$, $H_2$) identifies the operating voltage at which the first and second samples (-Δ-) and (-○-) thermal treatment with hydrogen atmosphere shows an abrupt change in leakage current. The point ($V_{take-off}$, $O_2$) identifies the operating voltage at which the comparative sample (-▽-), thermally treated only under an oxygen atmosphere, shows an abrupt change in leakage current. It is apparent from the tests performed that thermal treatment under hydrogen according to the invention increases the leakage current take-off point by approximately 0.5V over conventional thermal oxygen treatment. Since the capacitances of the first and second samples and the comparative sample were identical, it can be seen that the interface trap density at the interface between the electrode and the dielectric film of a capacitor thermally treated under hydrogen is reduced to thus increase the height of a Schottkey barrier.

In conclusion, leakage current at an operation voltage (e.g., 1.5V) is reduced by the thermal treatment of the dielectric under hydrogen atmosphere. Consequently, the thickness of the dielectric film used in the capacitor can be thinned to increase capacitance without increasing the detrimental effects caused by leakage current.

The present invention was described in detail by taking preferred embodiments as an example. However, the present invention is not limited to the above embodiments, and various modifications may be effected by those skilled in the art within the technical spirit of the present invention.

What is claimed is:

1. A capacitor fabricating method for a semiconductor device comprising the steps of:

forming a lower electrode on a semiconductor substrate;

forming a dielectric film on said lower electrode;

thermally treating said dielectric film under hydrogen atmosphere after the step of forming the dielectric film; and forming an upper electrode on said dielectric film.

2. The method according to claim 1, wherein said step of thermally treating the dielectric film under hydrogen atmosphere is performed using $H_2$ gas or $H_2$ plasma.

3. The method according to claim 2, wherein said step of thermally treating the dielectric film under hydrogen atmosphere is performed at a temperature of between approximately 300 to 600° C. for 5 to 60 minutes.

4. The method according to claim 3, wherein said step of thermally treating the dielectric film under hydrogen atmosphere is performed at a temperature of between approximately 300 to 500° C. for 5 to 30 minutes.

5. The method according to claim 1, wherein said lower electrode is formed of a material selected from the group consisting of impurity-doped polysilicon, metal, metal silicide, metal nitride or any combination thereof.

6. The method according to claim 1, wherein said dielectric film is formed of a material selected from the group consisting of a silicon oxide film ($SiO_2$), a silicon nitride film ($Si_3N_4$), a tantalum oxide film ($Ta_2O_5$), a titanium oxide film ($TiO_2$), an aluminum oxide film ($Al_2O_3$), PZT ($PbZr_xTi_{1-x}O_3$), BST($Ba_xSr_{1-x}TiO_3$), ST($SrTiO_3$), or any combination thereof.

7. The method according to claim 1, wherein said upper electrode is formed of a material selected from the group consisting of impurity-doped polysilicon, metal, metal silicide, metal nitride or any combination thereof.

8. The method according to claim 1, further comprising the steps of:

removing a native oxide film formed on a surface of said lower electrode before the step of forming said dielectric film to form a treated structure; and processing RTN (rapid thermal nitration) on the treated structure to form a further treated structure.

9. The method according to claim 8, further comprising the step of processing RTO (rapid thermal oxidation) on the further treated structure.

10. The method according to claim 1, further comprising the step of thermally treating the dielectric film under oxygen atmosphere before the step of thermally treating the dielectric film under hydrogen atmosphere.

11. The method according to claim 10, wherein the step of thermally treating the dielectric film under oxygen atmosphere is performed using a material selected from the group consisting of a wet $O_2$, a dry $O_2$, $N_2O$ gas or a plasma of each of said gases.

12. The method according to claim 11, wherein said step of thermally treating the dielectric film under oxygen atmosphere is performed at a temperature of between approximately 300 to 1000° C. for 5 to 60 minutes.

13. The method according to claim 1, further comprising the step of thermally treating the dielectric film under inert gas atmosphere before the step of thermally treating the dielectric film under hydrogen atmosphere.

14. The method according to claim 13, wherein the step of thermally treating the dielectric film under inert gas atmosphere is performed at a temperature of between approximately 500 to 900° C. for 5 to 60 minutes.

15. A capacitor fabricating method for a semiconductor device comprising the steps of:

forming a lower electrode on a semiconductor substrate;

forming a dielectric film on said lower electrode;

forming an upper electrode on said dielectric film to form a resultant structure with the lower electrode and dielectric film; and thermally treating the resultant structure on which said upper electrode is formed, under hydrogen atmosphere after the step of forming the upper electrode.

16. The method according to claim 15, wherein said step of thermally treating the resultant structure under hydrogen atmosphere is performed using $H_2$ gas or $H_2$ plasma.

17. The method according to claim 16, wherein said step of thermally treating the resultant structure under hydrogen atmosphere is performed at a temperature of between approximately 300 to 600° C. for 5 to 60 minutes.

18. The method according to claim 17, wherein said step of thermally treating the resultant structure under hydrogen atmosphere is performed at a temperature of between approximately 300 to 500° C. for 5 to 30 minutes.

19. The method according to claim 15, wherein said lower electrode is formed of a material selected from the group consisting of impurity-doped polysilicon, metal, metal silicide, metal nitride or any combination thereof.

20. The method according to claim 15, wherein said dielectric film is formed of a material selected from the group consisting of a silicon oxide film ($SiO_2$), a silicon nitride film ($Si_3N_4$), a tantalum oxide film ($Ta_2O_5$), a titanium oxide film ($TiO_2$), an aluminum oxide film ($Al_2O_3$), PZT($PbZr_xTi_{1-x}O_3$), BST($Ba_xSr_{1-x}TiO_3$), ST($SrTiO_3$), or any combination thereof.

21. The method according to claim 15, wherein said upper electrode is formed of a material selected from the group consisting of impurity-doped polysilicon, metal, metal silicide, metal nitride or any combination thereof.

22. The method according to claim 15, further comprising the steps of:

removing a native oxide film formed on the surface of said lower electrode before the step of forming said dielectric film to form a treated lower electrode; and processing RTN (rapid thermal nitration) on the treated lower electrode to form a further treated lower electrode.

23. The method according to claim 22, further comprising the step of processing RTO (rapid thermal oxidation) on the further treated lower electrode.

24. The method according to claim 15, further comprising the step of thermally treating the dielectric film under oxygen atmosphere before the step of forming the upper electrode.

25. The method according to claim 24, wherein the step of thermally treating the dielectric film under oxygen atmosphere is performed using a material selected from the group consisting of a wet $O_2$, a dry $O_2$, $N_2O$ gas or a plasma of each of said gases.

26. The method according to claim 25, wherein the step of thermally treating the dielectric film under oxygen atmosphere is performed at a temperature of between approximately 300 to 1000° C. for 5 to 60 minutes.

27. The method according to claim 15, further comprising the step of thermally treating the dielectric film under inert gas atmosphere before forming said upper electrode.

28. The method according to claim 27, wherein the step of thermally treating the dielectric film under inert gas atmosphere is performed at a temperature of between approximately 500 to 900° C. for 5 to 60 minutes.

* * * * *

UNITED STATES PATENT AND TRADEMARK OFFICE
CERTIFICATE OF CORRECTION

PATENT NO. : 6,136,641
DATED : October 24, 2000
INVENTOR(S) : Won et al.

It is certified that error appears in the above-identified patent and that said Letters Patent is hereby corrected as shown below:

Column 2,
Line 39, "conventionally to formed" should read -- conventionally formed --

Column 3,
Line 66, "except no that" should read -- expect that --

Signed and Sealed this

Thirtieth Day of July, 2002

Attest:

Attesting Officer

JAMES E. ROGAN
Director of the United States Patent and Trademark Office